(12) United States Patent
Chien et al.

(10) Patent No.: US 10,826,491 B1
(45) Date of Patent: Nov. 3, 2020

(54) CONTROL CIRCUIT FOR LOAD SWITCH

(71) Applicant: Excelliance MOS Corporation, Hsinchu County (TW)

(72) Inventors: Ming-Hung Chien, Hsinchu County (TW); Pei-Ting Yang, Hsinchu County (TW); Ching-Tsan Lee, Hsinchu County (TW)

(73) Assignee: Excelliance MOS Corporation, Hsinchu County (TW)

( * ) Notice: Subject to any disclaimer, the term of this patent is extended or adjusted under 35 U.S.C. 154(b) by 0 days.

(21) Appl. No.: 16/739,119

(22) Filed: Jan. 10, 2020

(30) Foreign Application Priority Data

Nov. 29, 2019 (TW) .............................. 108143531 A

(51) Int. Cl.
*H03K 17/687* (2006.01)
*H03K 3/03* (2006.01)
*H02M 3/07* (2006.01)

(52) U.S. Cl.
CPC ............ *H03K 17/687* (2013.01); *H02M 3/07* (2013.01); *H03K 3/0315* (2013.01)

(58) Field of Classification Search
CPC .. H03K 17/687; H03K 17/145; H03K 3/0315; H02M 3/07
See application file for complete search history.

(56) References Cited

U.S. PATENT DOCUMENTS

| 2004/0164815 | A1 | 8/2004 | Hulfachor et al. |
| 2014/0266475 | A1* | 9/2014 | Hinrichs ............... H03L 7/0995 331/57 |

FOREIGN PATENT DOCUMENTS

| TW | I232023 | 5/2005 |
| TW | I350437 | 10/2011 |

* cited by examiner

*Primary Examiner* — Sibin Chen
(74) *Attorney, Agent, or Firm* — JCIPRNET

(57) ABSTRACT

A control circuit of a load switch including a charge pump circuit, an oscillator, and a current signal generator is provided. The charge pump circuit generates a control signal according to a clock signal. The load switch is turned on or turned off according to the control signal. The oscillator generates the clock signal according to a control current. The current signal generator provides a resistor string to receive a power voltage. The resistor string of the current signal generator generates a sensed current or a sensed voltage according to the power voltage. The current signal generator generates the control current according to a reciprocal of the sensed current or a square of the sensed voltage. A frequency of the clock signal is negatively related to the power voltage.

11 Claims, 4 Drawing Sheets

CONTROL CIRCUIT FOR LOAD SWITCH

CROSS-REFERENCE TO RELATED APPLICATION

This application claims the priority benefit of Taiwan application serial no. 108143531, filed on Nov. 29, 2019. The entirety of the above-mentioned patent application is hereby incorporated by reference herein and made a part of this specification.

BACKGROUND

Technical Field

The invention relates to a control circuit, and more particularly, relates to a control circuit for a load switch.

Description of Related Art

In the conventional technical field, a load switch is disposed in an electronic circuit most of the time to control whether power voltage transmission to a medium of a load device is to be performed or not. When an electronic device is booted, the load switch is turned on according to a received control signal, and the power voltage may be transmitted to the load device. Comparatively, when the electronic device is shut down, the load switch is turned off according to the received control signal, and the power voltage is not transmitted to the load device.

It should be noted that since a voltage value of the power voltage may be changed, a rising time of the control signal generated through a charge pump circuit is related to a frequency of a clock signal received by the charge pump circuit, a stage number of the charge pump circuit, and a magnitude of the power voltage. The frequency of the clock signal may be a function of the power voltage. In the conventional technique, the frequency of the aforementioned clock signal is often designed to be a fixed value. Under such condition, a turn-on speed of the load switch may be changed along with the magnitude of the power voltage. In this case, a large in-rush current may occur most of the time along with an increase in the voltage value of the power voltage.

SUMMARY

The invention is directed to a control circuit of a load switch, which is adapted to maintain a switch turn-on speed without being affected by magnitude of a power voltage.

The invention provides a control circuit of a load switch including a charge pump circuit, an oscillator, and a current signal generator. The charge pump circuit generates a control signal according to a clock signal. The load switch is turned on or turned off according to the control signal. The oscillator generates the clock signal according to a control current. The current signal generator provides a resistor string to receive a power voltage. The resistor string of the current signal generator generates a sensed current or a sensed voltage according to the power voltage. The current signal generator generates the control current according to a reciprocal of the sensed current or a square of the sensed voltage. A frequency of the clock signal is negatively related to a voltage value of the power voltage.

Based on the above description, the control circuit of the invention provides a resistor string to receive a power voltage and generates a sensed current or a sensed voltage according to the power voltage. The control circuit further generates the control current according to a reciprocal of the sensed current or a square of the sensed voltage, generates the clock signal according to the control current, and generates the control signal that controls a turn-on speed of the load switch according to the clock signal through the charge pump circuit. Under the premise that the frequency of the clock signal is negatively related to the voltage value of the power voltage, a speed at which the charge pump circuit generates the control signal may be compensated, and a correlation between the turn-on speed of the load switch and the magnitude of the power supply voltage may be reduced.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
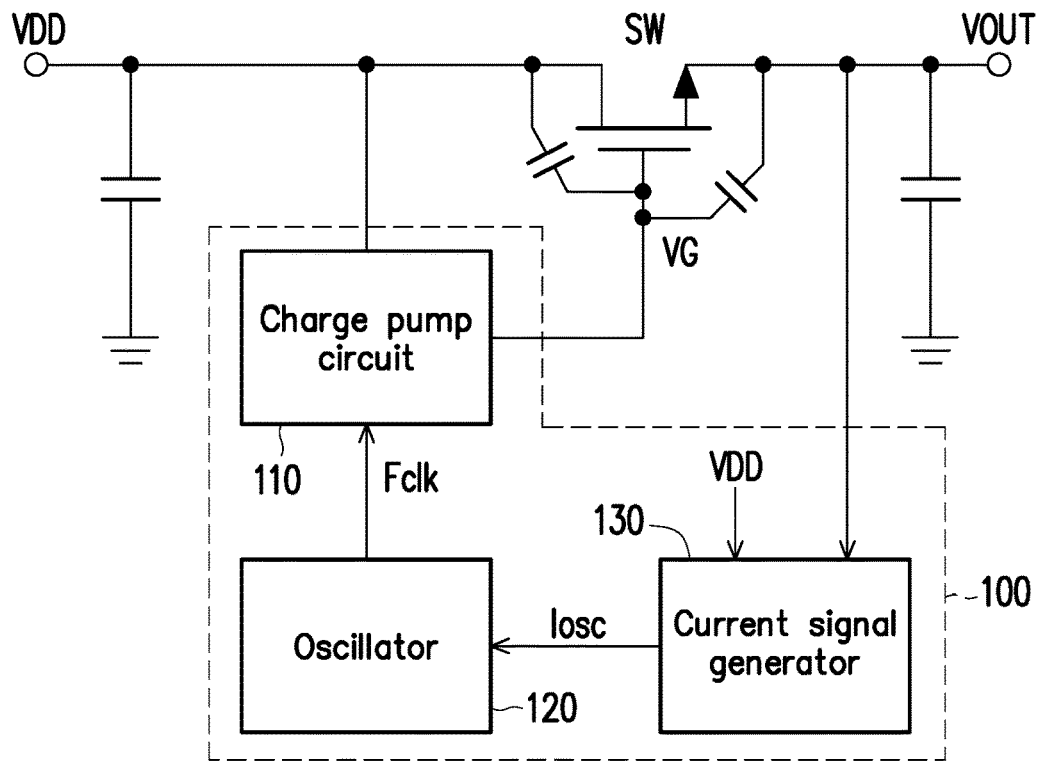
FIG. 1 is a schematic diagram illustrating a control circuit of a load switch according to an embodiment of the invention.

Referring to FIG. 1, FIG. 1 is a schematic diagram illustrating a control circuit of a load switch according to an embodiment of the invention. A control circuit 100 is coupled to a load switch SW composed of a transistor. The load switch SW receives a power voltage VDD and is turned on or turned off according to a control signal VG. When the load switch SW is turned on, the power voltage VDD may be transmitted to an output terminal through the load switch SW to generate an output voltage VOUT. The output voltage VOUT may be transmitted to a load device (not shown). In the embodiment, a voltage value of the power voltage VDD is not fixed.

The control circuit 100 includes a charge pump circuit 110, an oscillator 120, and a current signal generator 130. The current signal generator 130 receives the power voltage VDD. The current signal generator 130 provides a resistor string to receive the power voltage VDD. The resistor string of the current signal generator 130 may generate a sensed current or a sensed voltage according to the power voltage VDD. The current signal generator 130 generates a control current Iosc according to a reciprocal of the sensed current, or the current signal generator 130 may generate the control current Iosc according to a square of the sensed voltage.

The oscillator 120 is coupled to the current signal generator 130 and receives the control current Iosc generated by the current signal generator 130. The oscillator 120 may generate a clock signal Fclk according to the control current Iosc. Magnitude of the control current Iosc may be related to, for example, positively related to, a frequency of the clock signal Fclk. In the embodiment, the oscillator 120 may be a current control oscillator.

The charge pump circuit 110 is coupled to the oscillator 120 and receives the clock signal Fclk generated by the oscillator 120. The charge pump circuit 110 further receives the power voltage VDD and executes a charge pump operation according to the lock signal Fclk based on the power voltage VDD, so as to generate the control signal VG.

It should be noted that the magnitude of the control current Iosc generated by the current signal generator 130 is negatively related to the voltage value of the power voltage VDD. Namely, when the voltage value of the power voltage VDD is increased, the control current Iosc correspondingly generated by the current signal generator 130 is decreased. Accordingly, the frequency of the clock signal Fclk generated by the oscillator 120 is decreased.

Under such condition, although the voltage value of the power voltage VDD received by the charge pump circuit 110 is increased, a rising time of the control signal VG may be maintained to be substantially unchanged based on the decrease in the frequency of the clock signal Fclk. Namely, a turn-on speed of the load switch SW may be maintained without being affected by a change of the power voltage VDD.

Comparatively, when the voltage value of the power voltage VDD is decreased, the control current Iosc correspondingly generated by the current signal generator 130 is increased. Accordingly, the frequency of the clock signal Fclk generated by the oscillator 120 is increased. Under such condition, the rising time of the control signal VG generated by the charge pump circuit 110 may be maintained to be substantially unchanged. That is, the turn-on speed of the load switch SW may be maintained without being affected by the change of the power voltage VDD.

Figure 2A:
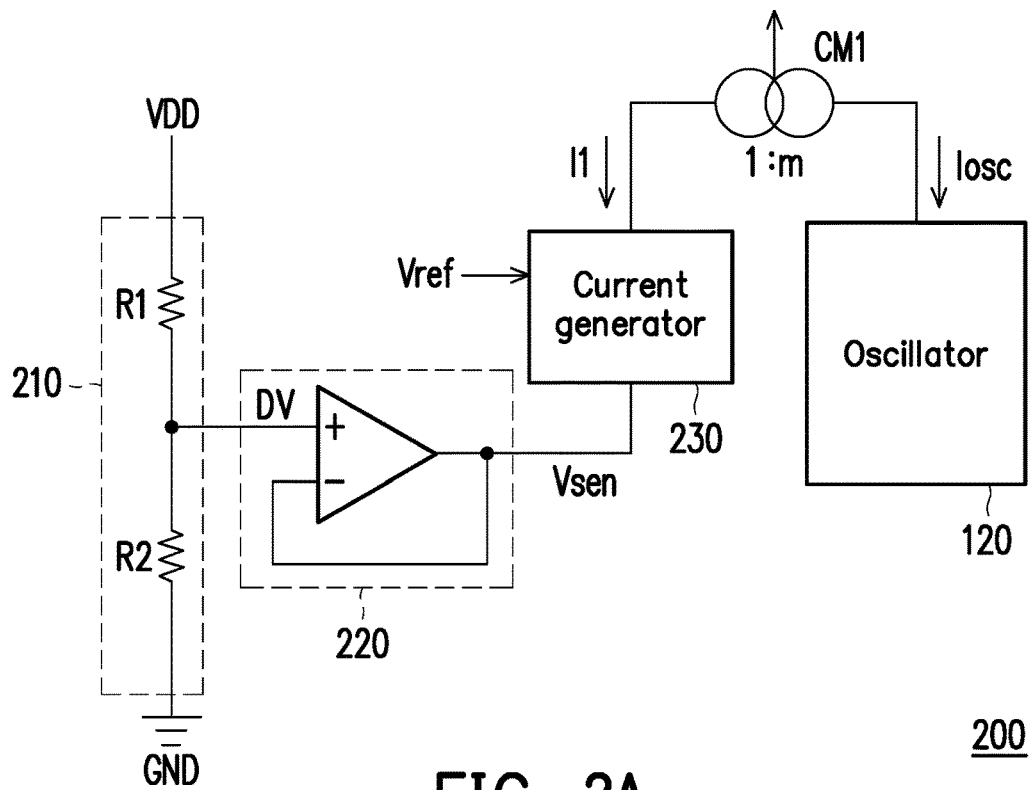
FIG. 2A is a schematic diagram illustrating a current signal generator of a control circuit according to an embodiment of the invention.

Referring to FIG. 2A, FIG. 2A is a schematic diagram illustrating a current signal generator of a control circuit according to an embodiment of the invention. A current signal generator 200 includes a resistor string 210, a voltage buffer 220, a current generator 230, and a current mirror CM1. The resistor string 210 receives the power voltage VDD and is coupled to a reference voltage terminal GND. In the embodiment, the resistor string 210 includes resistors R1 and R2 connected in series, and the reference voltage terminal GND may be a ground terminal. The resistor string 210 is configured as a voltage-dividing circuit and is used for dividing the power voltage VDD to generate a divided voltage DV. The voltage buffer 220 is coupled to the resistor string 210 to receive the divided voltage DV and generates a sensed voltage Vsen according to the divided voltage DV. The current generator 230 is coupled to the voltage buffer 220 to receive a reference voltage Vref and the sensed voltage Vsen. The current generator 230 calculates a difference between the reference voltage Vref and the sensed voltage Vsen and generates a current I1 according to a square of the difference between the reference voltage Vref and the sensed voltage Vsen.

On the other hand, the current generator 230 is coupled to the current mirror CM1. The current mirror CM1 receives the current I1 and generates the control current Iosc by mirroring the current I1. The control current Iosc is provided to the oscillator 120. In the embodiment, a current mirror ratio of the current mirror CM1 may be 1:m, where m may be any real number.

It should be noted that in the embodiment, the reference voltage Vref may be predetermined as a fixed value, and the current I1 generated based on the square of the difference between the reference voltage Vref and the sensed voltage Vsen may be negatively related to the power voltage VDD. Therefore, the control current Iosc generated by mirroring the current I1 may also be negatively related to the power voltage VDD.

Moreover, the voltage buffer 220 of the embodiment is a voltage follower. The sensed voltage Vsen generated by the voltage buffer 220 is substantially equal to the divided voltage DV.

Figure 2B:
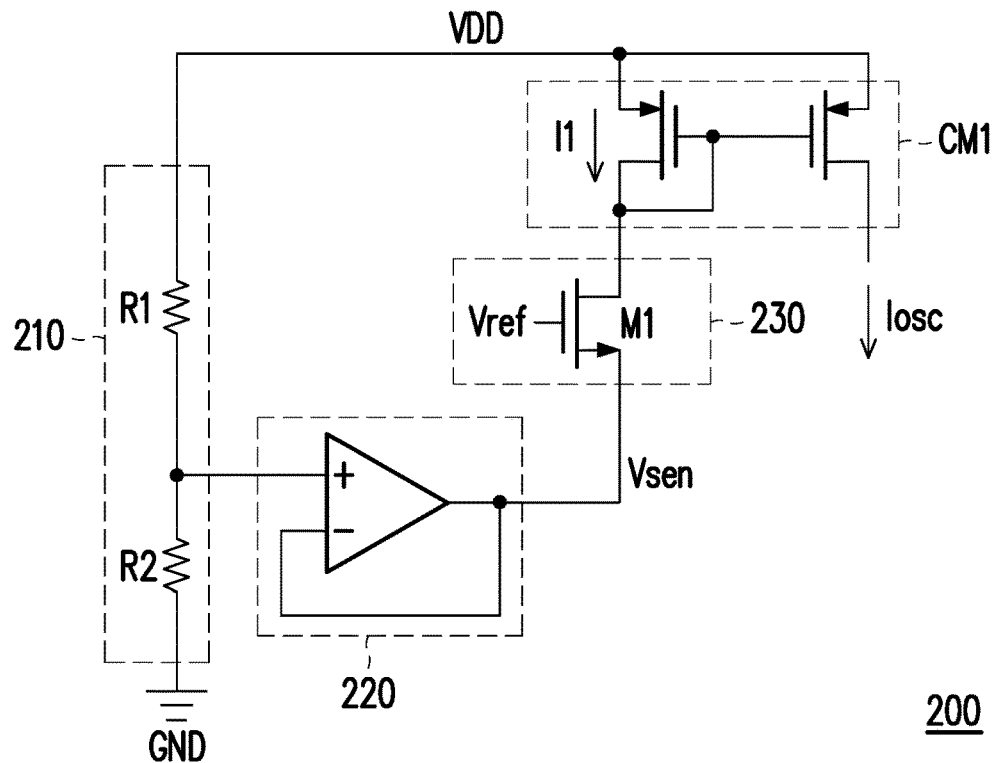
FIG. 2B is a schematic diagram illustrating another implementation of the current signal generator of FIG. 2A according to an embodiment of the invention.

Referring to FIG. 2B, FIG. 2B is a schematic diagram illustrating another implementation of the current signal generator of FIG. 2A according to an embodiment of the invention. Different from FIG. 2A, in the embodiment of FIG. 2B, the current generator 230 is composed of a transistor M1. A first terminal of the transistor M1 receives the sensed voltage Vsen, and a control terminal of the transistor M1 receives the reference voltage Vref. A second terminal of the transistor M1 is coupled to the current mirror CM1, and the transistor M1 drains the current I1 from the current mirror CM1 through the second terminal thereof.

It should be noted that in the embodiment, the transistor M1 works in a saturation region. The current I1 drained by the transistor M1 is $$I1 = \left(VREF - VDD \times \frac{R2}{R1 + R2}\right)^2.$$

A current value of the control current Iosc is equal to a product of m and the current I1.

Figure 3A:
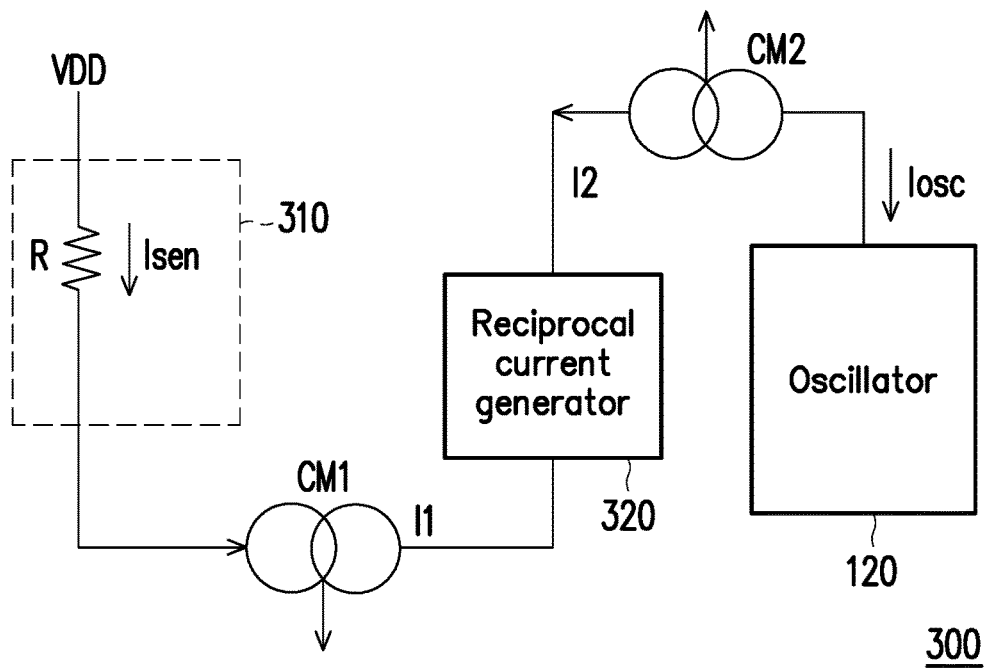
FIG. 3A is a schematic diagram illustrating a current signal generator of a control circuit according to another embodiment of the invention.

Referring to FIG. 3A, FIG. 3A is a schematic diagram illustrating a current signal generator of a control circuit according to another embodiment of the invention. A current signal generator 300 is coupled to the oscillator 120. The current signal generator 300 includes a resistor string 310, a current mirror CM1, a reciprocal current generator 320, and a current mirror CM2. In the embodiment, the resistor string 310 receives the power voltage VDD and is used for generating a sensed current Isen. The resistor string 310 has one or a plurality of resistors R and generates the sensed current Isen through the received power voltage VDD. The current mirror CM1 is coupled to the resistor string 310 to receive the sensed current Isen and generates a current I1 by mirroring the sensed current Isen.

On the other hand, the reciprocal current generator 320 is coupled to the current mirror CM1 and receives the current I1. The reciprocal current generator 320 is configured to generate a current I2 according to a reciprocal (multiplicative inverse element) of the current I1. The current mirror CM2 is coupled between the reciprocal current generator 320 and the oscillator 120 and is configured to mirror the current I2 to generate the control current Iosc. The control current Iosc is provided to the oscillator 120.

In the embodiment, as the current I1 is positively related to the power voltage VDD, the current I2 is negatively related to the power voltage VDD. Therefore, the current signal generator 300 may generate the control current Iosc negatively related to the power voltage VDD.

Figure 3B:
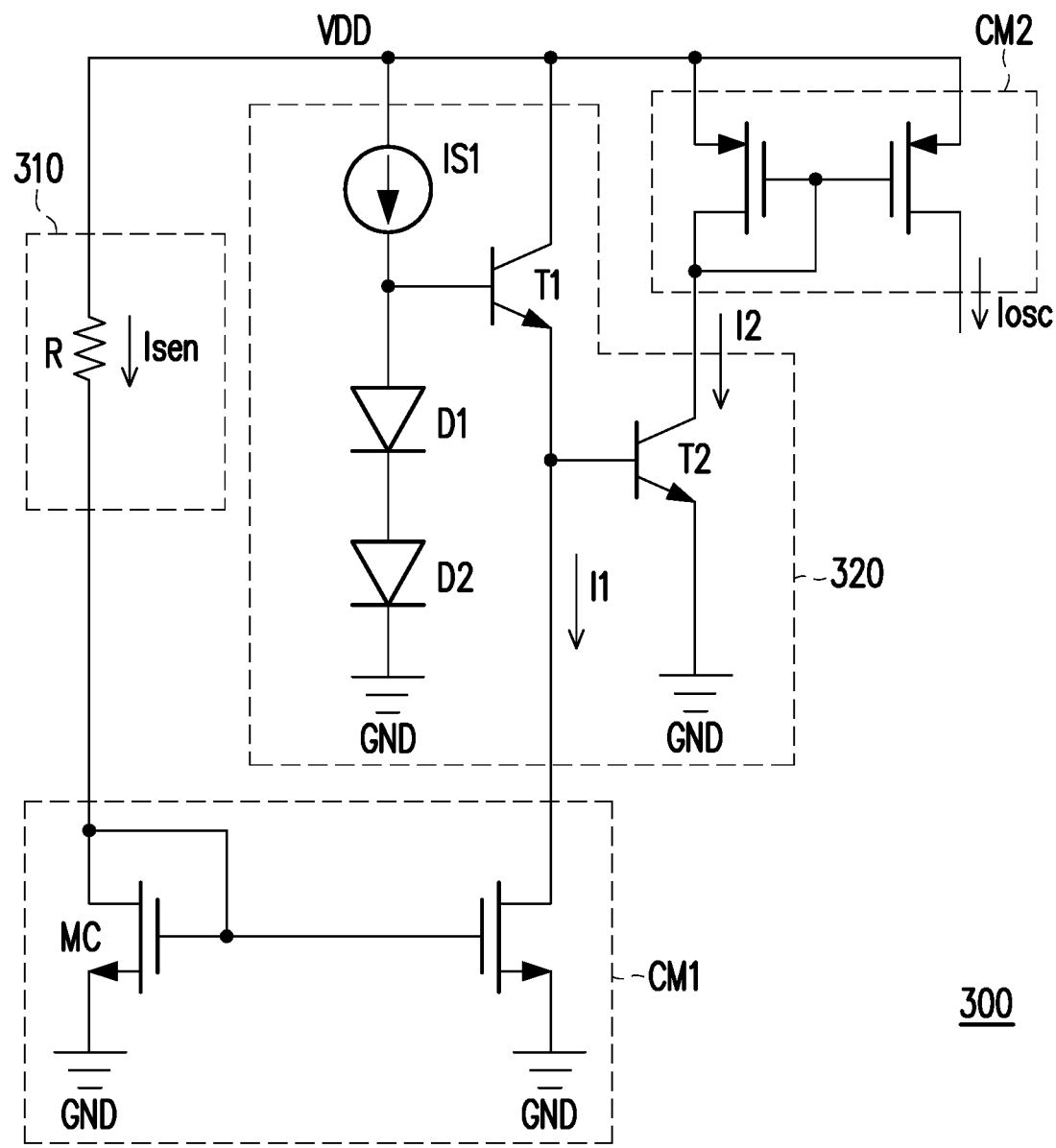
FIG. 3B is a schematic diagram illustrating an implementation of the current signal generator of FIG. 3A according to an embodiment of the invention.

Referring to FIG. 3B, FIG. 3B is a schematic diagram illustrating an implementation of the current signal generator of FIG. 3A according to an embodiment of the invention. Corresponding to FIG. 3A, the reciprocal current generator 320 includes a reference current source IS1, diodes D1 and D2, and transistors T1 and T2 in FIG. 3B. One end of the reference current source IS1 receives the power voltage VDD, and another end of the reference current IS1 is coupled to an anode of the diode D1 and is configured to provide a reference current to the anode of the diode D1. A cathode of the diode D1 is coupled to an anode of the diode D2, and a cathode of the diode D2 is coupled to the reference voltage terminal GND.

Moreover, a first terminal of the transistor T1 receives the power voltage VDD, a control terminal of the transistor T1 is coupled to the anode of the diode D1, and a second terminal of the transistor T1 is coupled to the current mirror CM1. A first terminal of the transistor T2 is coupled to the current mirror CM2, a control terminal of the transistor T2 is coupled to the second terminal of the transistor T2, and a second terminal of the transistor T2 is coupled to the reference voltage terminal GND. The current mirror CM1 drains the current I1 from the second terminal of the transistor T1, and the first terminal of the transistor T2 drains the current I2 from the current mirror CM2. In the embodiment, the transistors T1 and T2 are all NPN-type bipolar junction transistors (BJTs).

In the embodiment, current mirror ratios of the current mirrors CM1 and CM2 are, for example, respectively n:1 and 1:m. The sensed current Isen may be represented as: Isen=(VDD−VGSN)/R, where VGSN is a gate-source voltage difference of a transistor MC in the current mirror CM1. The control current Iosc may be represented as $$I_{OSC} = \frac{m \times n \times I_{REF}^2}{I_{SEN}} = \frac{m \times n \times R \times I_{REF}^2}{VDD - VGSN},$$

where $I_{REF}$ is a reference current provided by the reference current source IS1. The aforementioned m and n may be any real numbers.

According to the above description, it is known that the control current Iosc is negatively related to the power voltage VDD.

It should be noted that the diodes D1 and D2 in FIG. 3B may be implemented by transistors.

Figure 3C:
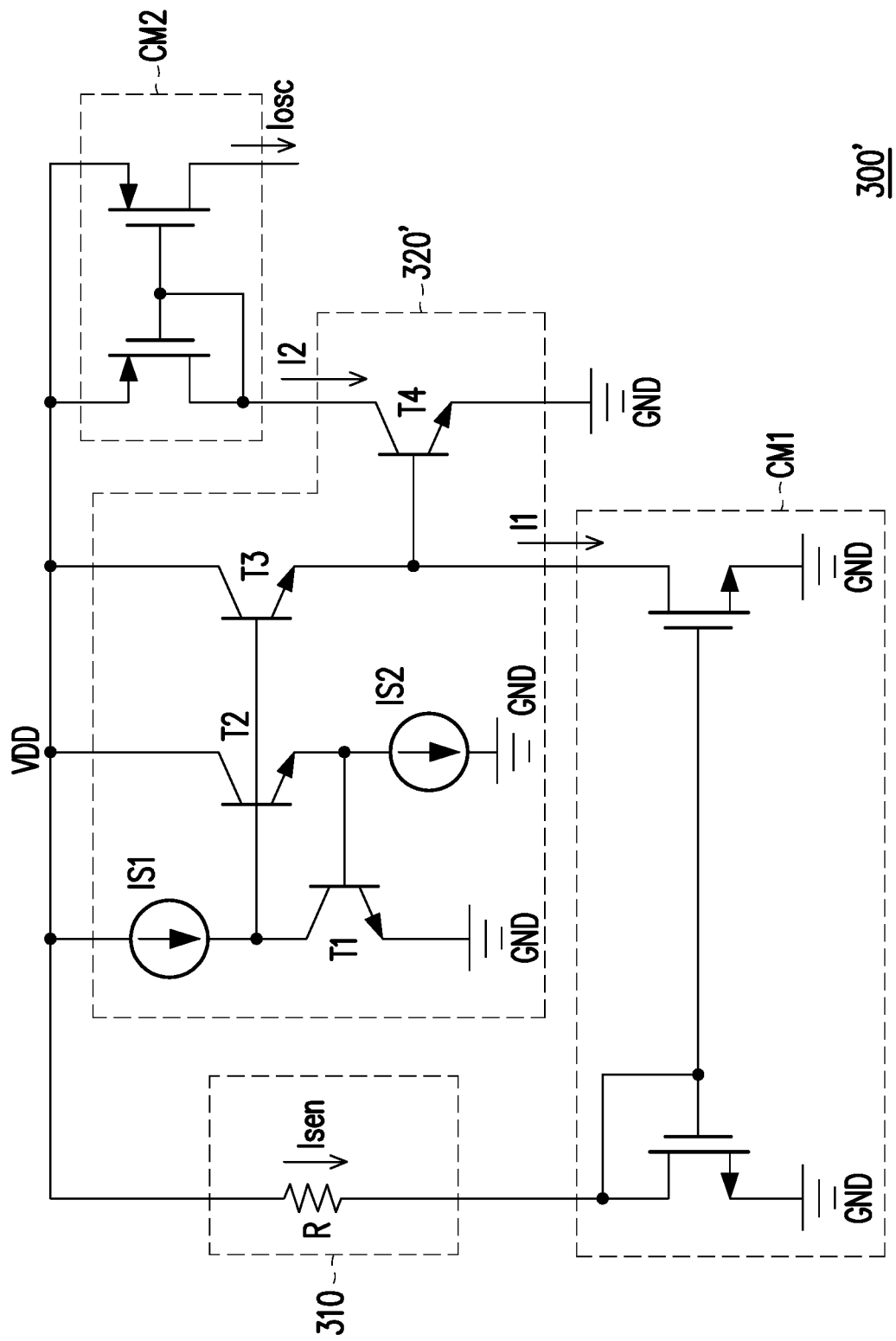
FIG. 3C is a schematic diagram illustrating another implementation of the current signal generator of FIG. 3A according to an embodiment of the invention.

Referring to FIG. 3C, FIG. 3C is a schematic diagram illustrating another implementation of the current signal generator of FIG. 3A according to an embodiment of the invention. A current signal generator 300' includes a resistor string 310, a current mirror CM1, a reciprocal current generator 320', and a current mirror CM2. Different from the embodiment of FIG. 3B, the reciprocal current generator 320' of the embodiment includes reference current sources IS1 and IS2 and transistors T1-T4. One end of the reference current source IS1 receives the power voltage VDD, and another end of the reference current source IS1 is coupled to a first terminal of the transistor T1, a control terminal of the transistor T2, and a control terminal of the transistor T3. A control terminal of the transistor T1 is coupled to a second terminal of the transistor T2, and a second terminal of the transistor T1 is coupled to the reference voltage terminal GND. First terminals of the transistors T2 and T3 commonly receive the power voltage VDD, and the reference current source IS2 is coupled between the transistor T2 and the reference voltage terminal GND. A second terminal of the transistor T3 is coupled to the current mirror CM1 and a control terminal of the transistor T4 and provides the current I1 to the current mirror CM1. Moreover, a first terminal of the transistor T4 is coupled to the current mirror CM2 and drains the current I2 from the current mirror CM2. A second terminal of the transistor T4 is coupled to the reference voltage terminal GND.

In the embodiment, current mirror ratios of the current mirrors CM1 and CM2 are, for example, respectively n:1 and 1:m. The transistors T1-T4 are exemplified as having a same electrical characteristic. According to the circuit diagram of FIG. 3C, a first equation VBE1+VBE2=VBE3+VBE4 is created, where VBE1-VBE4 are respectively bulk-emitter voltage differences of the transistors T1-T4. A current equation of transistor:

$$VBE = V_T \ln\left(\frac{I_C}{I_S}\right)$$

is provided, where $V_T$ is a thermal voltage of the transistor and $I_C$ and $I_S$ are respectively a collector current and a saturation current of the transistor, and the aforementioned equation may be changed to a second equation:

$$\ln\left(\frac{I_{C1}}{I_S}\right) + \ln\left(\frac{I_{C2}}{I_S}\right) = \ln\left(\frac{I_{C3}}{I_S}\right) + \ln\left(\frac{I_{C4}}{I_S}\right),$$

where $I_{C1}$-$I_{C4}$ are respectively collector currents of the transistors T1-T4.

According to the second equation, $$I_{C4} = \frac{I_{C1} \times I_{C2}}{I_{C3}}$$

may be calculated, and the control current $$I_{OSC} = I_{C4} = \frac{I_{REF} \times I_{REF}}{Isen} = \frac{m \times n \times R \times I_{REF}^2}{VDD - VGSN}$$

is further deduced, where m and n may be 1, and $I_{REF}$ is a reference current provided by the reference current sources IS1 and IS2.

According to the above description, it is known that the current signal generator provided by the embodiments of the invention may generate the control current Iosc negatively related to the power voltage VDD.

In summary, the invention provides the resistor string to receive the power voltage, and treats the sensed current or the sensed voltage generated according to the power voltage as a reference for generating the control current and accordingly generates the control current negatively related to the power voltage. In this way, the oscillator may provide the clock signal with the frequency negatively related to the power voltage. As such, the rising time of the control signal generated by the charge pump circuit may not be changed along with an increase or a decrease in voltage value of the power voltage, so that the effective working performance of the load switch is maintained.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A control circuit of a load switch, comprising:
   a charge pump circuit, generating a control signal according to a clock signal, and the load switch being turned on or turned off according to the control signal;
   an oscillator, generating the clock signal according to a control current; and
   a current signal generator, providing a resistor string to receive a power voltage, wherein the resistor string of the current signal generator generates a sensed current or a sensed voltage according to the power voltage, and the current signal generator generates the control current according to a reciprocal of the sensed current or a square of the sensed voltage,
   wherein a frequency of the clock signal is negatively related to a voltage value of the power voltage.

2. The control circuit as claimed in claim 1, wherein the charge pump circuit performs a charge pump operation according to the clock signal based on the power voltage to generate the control signal.

3. The control circuit as claimed in claim 1, wherein the current signal generator comprises:
   the resistor string, dividing the power voltage to generate a divided voltage;
   a voltage buffer, coupled to the resistor string and generating the sensed voltage according to the divided voltage;
   a current generator, coupled to the voltage buffer and generating a first current according to a square of a difference between a reference voltage and the sensed voltage; and
   a current mirror, coupled to the current generator and mirroring the first current to generate the control current.

4. The control circuit as claimed in claim 3, wherein the current generator is a transistor, a first terminal of the transistor receives the sensed voltage, a control terminal of the transistor receives the reference voltage, and a second terminal of the transistor generates a square current,
   wherein the transistor works in a saturation region.

5. The control circuit as claimed in claim 3, wherein the voltage buffer is a voltage follower.

6. The control circuit as claimed in claim 1, wherein the current signal generator comprises:
   the resistor string, generating a sensed current according to the power voltage;
   a first current mirror, mirroring the sensed current to generate a first current; and
   a reciprocal current generator, receiving the first current and generating a second current according to a reciprocal of the first current.

7. The control circuit as claimed in claim 6, wherein the current signal generator further comprises:
   a second current mirror, receiving the second current and mirroring the second current to generate the control current.

8. The control circuit as claimed in claim 6, wherein the reciprocal current generator comprises:
   a reference current source, providing a reference current;
   a first diode, having an anode receiving the reference current;
   a second diode, having an anode coupled to a cathode of the first diode, and a cathode of the second diode coupled to a reference voltage terminal;
   a first transistor, having a first terminal receiving the power voltage, a control terminal of the first transistor coupled to the anode of the first diode, and a second terminal of the first transistor receiving the first current; and
   a second transistor, having a first terminal generating the second current, a control terminal of the second transistor coupled to the second terminal of the first transistor, and a second terminal of the second transistor coupled to the reference voltage terminal.

9. The control circuit as claimed in claim 8, wherein the second diode is a fourth transistor, a control terminal of the fourth transistor is coupled to a first terminal of the fourth transistor and coupled to the cathode of the first diode, and a second terminal of the fourth transistor is coupled to the reference voltage terminal.

10. The control circuit as claimed in claim 1, wherein the reciprocal current generator comprises:
    a first reference current source, providing a first reference current;
    a first transistor, having a first terminal receiving the first reference current, and a second terminal of the first transistor coupled to a reference voltage terminal;
    a second transistor, having a first terminal receiving the power voltage, a control terminal of the second transistor coupled to the first terminal of the first transistor, and a second terminal of the second transistor coupled to the control terminal of the first transistor;
    a second reference current source, coupled between the control terminal of the first transistor and the reference voltage terminal and configured to provide a second reference current;
    a third transistor, having a first terminal receiving the power voltage, a control terminal of the third transistor coupled to the control terminal of the second transistor, and a second terminal of the third transistor receiving the first current; and
    a fourth transistor, having a first terminal generating the second current, a control terminal of the fourth transistor coupled to the second terminal of the third transistor, and a second terminal of the fourth transistor coupled to the reference voltage terminal.

11. The control circuit as claimed in claim 1, wherein the oscillator is a current control oscillator.

* * * * *